(12) United States Patent
Murata (10) Patent No.: US 6,751,160 B1
(45) Date of Patent: Jun. 15, 2004

(54) MEMORY CONTROL WITH BURST-ACCESS CAPABILITY

(75) Inventor: Masahiko Murata, Chofu (JP)

(73) Assignee: Canon Kabushiki Kaisha, Tokyo (JP)

( * ) Notice: Subject to any disclaimer, the term of this patent is extended or adjusted under 35 U.S.C. 154(b) by 130 days.

(21) Appl. No.: 08/678,699

(22) Filed: Jul. 11, 1996

(30) Foreign Application Priority Data

Jul. 14, 1995 (JP) .............................................. 7-179086

(51) Int. Cl.[7] ................................................. G11C 8/04
(52) U.S. Cl. ..................................... 365/239; 711/218
(58) Field of Search ............................ 365/233.5, 239; 711/104, 105, 218

(56) References Cited

U.S. PATENT DOCUMENTS

| | | | | |
|---|---|---|---|---|
| 5,319,759 A | * | 6/1994 | Chan ........................... | 711/217 |
| 5,526,320 A | * | 6/1996 | Zagar et al. .............. | 365/233.5 |
| 5,550,784 A | * | 8/1996 | Takai .......................... | 365/233 |
| 5,603,041 A | * | 2/1997 | Carpenter et al. .......... | 395/309 |
| 5,657,287 A | * | 8/1997 | McLaury et al. ...... | 365/230.01 |
| 5,659,515 A | * | 8/1997 | Matsuo et al. .............. | 365/222 |

OTHER PUBLICATIONS

Graphic Symbols for Logic Function–IEEE Std 91a–1991 and IEEE Std 91–1984; 1991; pp. S–34 & 81.*

* cited by examiner

*Primary Examiner*—David L. Robertson
(74) *Attorney, Agent, or Firm*—Fitzpatrick, Cella, Harper & Scinto (57) ABSTRACT

A memory control apparatus which can effect memory high speed when performing a burst access from a CPU or the like to a memory is provided. When the access from the CPU is started, lower digits of the first address of the burst access are set into a counter. The CPU updates the data at a reading timing. By using the counter, the memory executes the access and the data obtained is stored into a latch. With this method, the data is read out from the memory earlier than conventionally, access can be executed at a high speed.

4 Claims, 5 Drawing Sheets

MEMORY CONTROL WITH BURST-ACCESS CAPABILITY

BACKGROUND OF THE INVENTION

1. Field of the Invention

The invention relates to a memory control apparatus which can effect access to a memory from a CPU or the like at a high speed.

2. Related Background Art

Hitherto, in such a memory control apparatus, address information which is outputted from a processor such as a CPU or the like is supplied as is to a memory, and a memory access is performed. To raise memory accessing speed, means for dividing the memory into two blocks in advance and alternately accessing one or the other of them, or means for dividing the memory into more than two blocks and sequentially accessing each has been used.

However, according to the method of directly supplying the address that is outputted from the CPU or the like to the memory, propagation delay of the address signal to the memory, access time of the memory, propagation delay of the data to the CPU, and the like, are added, so that the accessing speed decreases. According to the method of dividing the memory into two or more blocks, an address and a data bus are needed for every memory block, and so the circuit is complicated, and the circuit scale enlarges.

SUMMARY OF THE INVENTION

According to an embodiment of the invention, there is provided a memory control apparatus for performing a burst access, comprising: counter means which can load each word in a burst cycle to a memory address line which is selected; and data holding means for temporarily holding data read out from a memory, wherein the first address of the burst access in a memory reading cycle that is generated by an apparatus for reading out data from the memory is loaded into the counter means, and before a timing to read the data in each reading cycle of the burst access, the data read out from the memory is held into the data holding means by using the address from the counter means, the counter means is counted up, and the address is progressed to a next address.

DETAILED DESCRIPTION OF THE PREFERRED EMBODIMENTS

Embodiments of the invention will now be described in detail herinbelow with reference to the drawings.

First Embodiment

Figure 1:
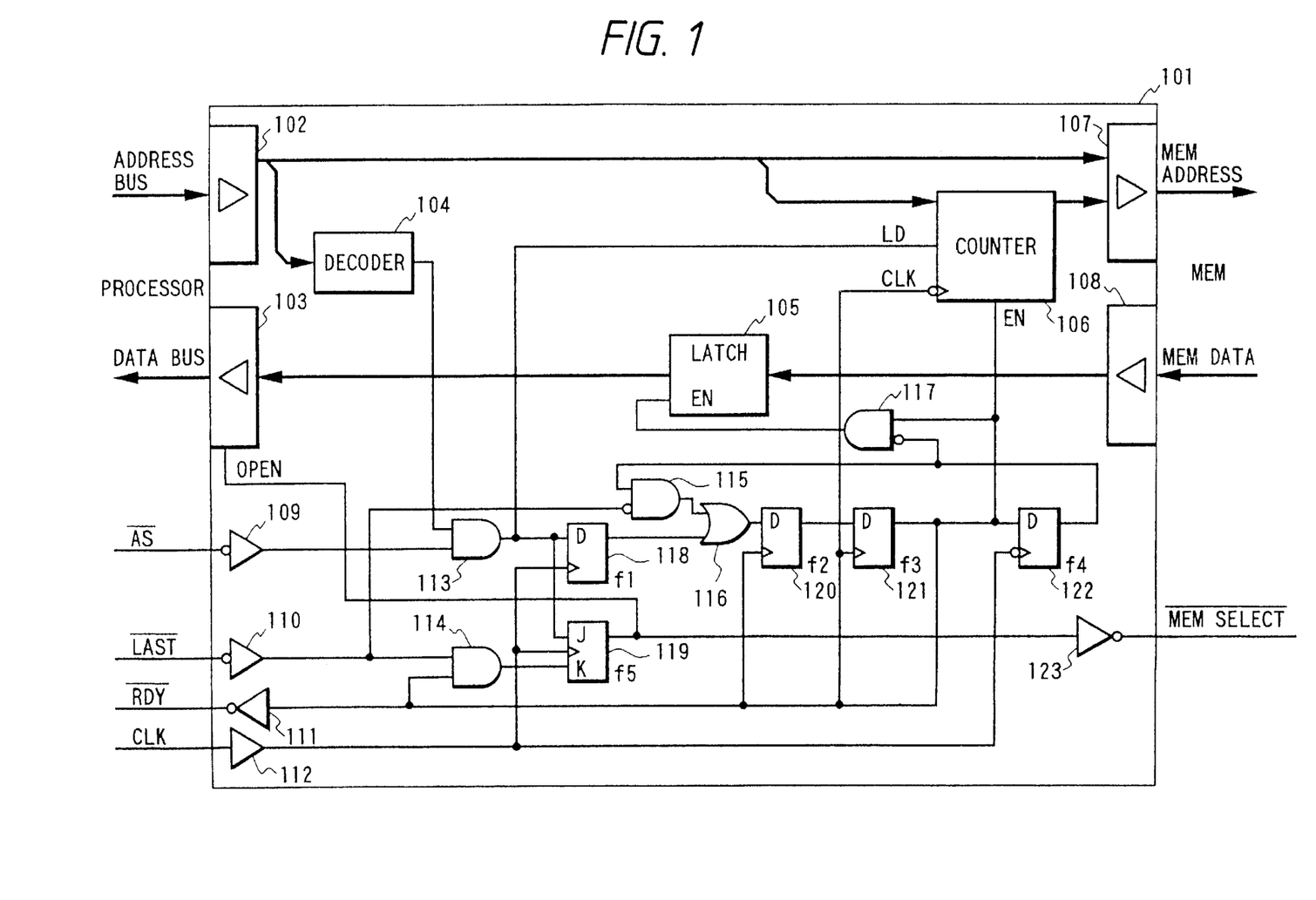
FIG. 1 is a block diagram showing the first embodiment of the invention.
Figure 2:
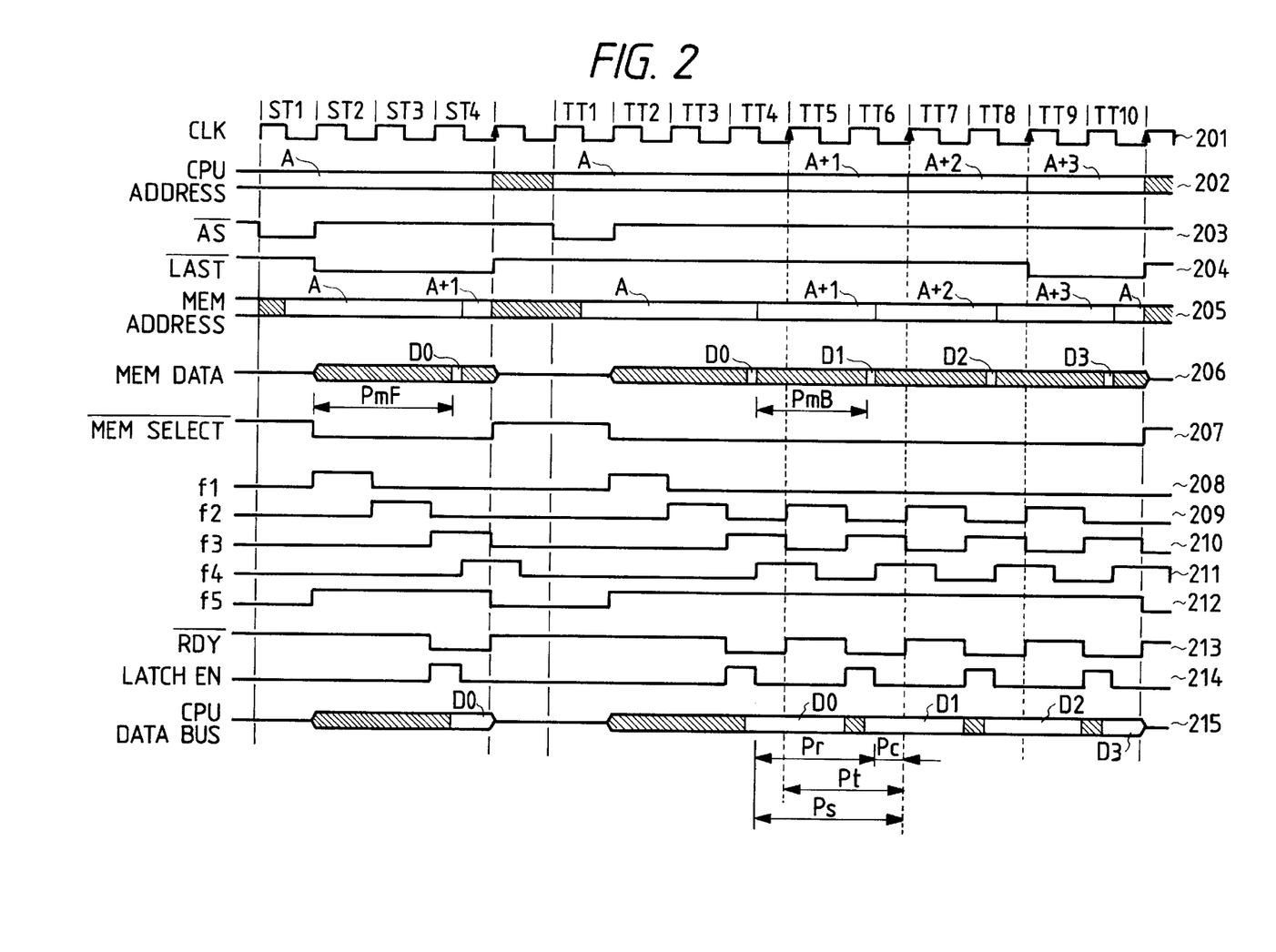
FIG. 2 is a timing chart for the first embodiment.

FIGS. 1 and 2 show the first embodiment to which the invention is applied. FIG. 1 is a block diagram thereof. In FIG. 1, reference numeral 101 denotes a memory control apparatus embodying the invention. In this embodiment, for example, the memory control apparatus is realized by an ASIC (Application Specific Integrated Circuit) such as a gate array. A processor (not shown) such as a CPU or the like is connected to the left side of the diagram. A memory (not shown) such as a ROM or the like is connected to the right side of the diagram. Reference numeral 102 denotes an input buffer for receiving an address from the CPU; 103 an output buffer for driving a data bus of the CPU; 104 a decoder for selecting an address in the memory area; 105 a latch to hold the data read out from the memory; 106 a counter for loading the lower two bits of the address from the CPU and counting up; 107 an output buffer for outputting a memory address to the memory; and 108 an input buffer for receiving the memory data from the memory.

Reference numeral 109 denotes an input buffer for receiving an address strobe signal ($\overline{AS}$) for the CPU to indicate the start of the access; 110 an input buffer for receiving a last signal ($\overline{LAST}$) for the CPU to indicate the end of the access; and 111 an output buffer for outputting to the CPU a ready signal ($\overline{RDY}$) indicating that the reading operation can be performed.

Reference numeral 112 denotes an input buffer for receiving a clock signal from the CPU; 113 to 117 logic gates for deciding conditions to generate a timing; and 118 to 122 flip-flops to generate an access sequence.

Reference numeral 123 denotes an output buffer for outputting a memory select signal ($\overline{MEM\ SELECT}$) to the memory.

FIG. 2 is a timing chart showing the operation of each unit of the first embodiment. In FIG. 2, reference numeral 201 denotes a system clock and 202 indicates an address signal from the CPU.

Reference numeral 203 denotes an address strobe signal ($\overline{AS}$); 204 a last signal ($\overline{LAST}$) indicative of the last word of the access; 205 a memory address which is provided from the memory control apparatus to the memory; 206 memory data that is outputted from the memory; 207 a memory select signal ($\overline{MEM\ SELECT}$) for making the memory operative; 208 to 212 output signals of the flip-flops in the memory control apparatus; and 213 a ready signal ($\overline{RDY}$) sent to the CPU, indicating that data can now be written.

Reference numeral 214 denotes an enable signal of the latch 105 in FIG. 1. When the enable signal 214 is at the H level, the input data is transmitted to an output. When the enable signal is at the L level, the input data is held. Reference numeral 215 denotes a data bus to output the data to the CPU. ST1 to ST4 indicate processing steps of the reading cycle of one word. TT1 to TT10 denote processing steps of the burst reading cycle of four words.

The operation of this embodiment will now be described with reference to FIGS. 1 and 2. First, the operation of the CPU will be explained. The CPU sets an address to be accessed on the CPU address bus in the first step, and generates the address strobe signal indicative of the start of the access for a period of time of one clock. In the next step, if the data to be read is the last data, the signal LAST is driven. When the data to be read is not the last data, the signal LAST is not driven. After that, the ready signal $\overline{RDY}$ is sampled at the leading edge of a clock signal which marks the end of a given step STn (see FIG. 2, with n=1, 2, 3 or 4 in that example), and as described herein signals the start of a next step. If the sampled ready signal RDY is at the H level, the processing routine advances directly to the next step. If the sampled ready signal is at the L level, the value on the CPU data bus is fetched. If this read data which was fetched is the last data to be accessed, the cycle is finished, and the processing routine is returned to the initial state. When the data to be read is not the last data, the processing routine advances to the next step. The CPU increases the CPU address by one and enters a state of sampling the ready signal. In this instance, if the data to be read in this step is the last data, the signal LAST is driven. In a manner similar to the above, the reading cycle is repeated. As mentioned above, the CPU generates each of the possible burst reading cycles, which can have from one word to up to four words in a burst. This embodiment is made to connect the memory to the CPU having such a memory reading sequence.

In FIG. 2, ST1 to ST4 denote the processing steps for the access of only one word; TT1 to TT4 the processing steps for the access of the first word of a burst access of four words; TT5 and TT6 the processing steps for the access of the second word; TT7 and TT8 the processing steps for the access of the third word; TT9 and TT10 the processing steps for the access of the last word. Arrows on the clock signal 201 indicate timings at which the L level of the ready signal is sampled in each step and the CPU reads the data.

In a case of accessing only one word, the CPU sets an address A on the address bus 202 in step ST1 and generates the address strobe signal. A check is made to see if the address A is one in which the memory has been mapped by the decoder 104. The address strobe signal is inputted to the gate 113 through the input buffer 109. When the decoder output is generated, the gate 113 is turned on and the signal is inputted to a load input LD of the counter 106. Thus, the lower two bits in the CPU address A are loaded into the counter 106 upon the occurrence of a leading edge of the clock in step ST1. The loaded address is outputted to the memory as a memory address together with the upper bits through the output buffer 107. The gate output 113 is simultaneously inputted to a D input of the flip-flop f1 118 and a J input of the flip-flop f5 119. Those flip-flops are set by the next leading edge of the clock, which signals the start of step ST2. Since the flip-flop f5 is set, the output buffer 103 is enabled and the data bus of the CPU is driven. The data in this instance is unidentified data because the data is not yet accessed from the memory. At the same time, the memory select signal is driven through the output buffer 123 and the memory is enabled. From the memory, the data stored in the inputted memory address A is outputted to the memory data bus by the memory select signal. However, a certain amount of time is needed for the data to be correctly set.

In FIG. 2, a straight line portion on the memory data bus 206 shows a high impedance state in which the memory doesn't drive the bus. A portion masked as a hatched region indicates a period of time during which the unidentified data (i.e., a period of time during which the data bus is not considered to hold the data accessed at the current memory address, as mentioned above) is driven. A white portion indicates a period of time during which the identified correct data is driven. Therefore, during the period of time from the memory select signal to the identified data, the memory access is needed, and that period is shown as PmF in the diagram. In a case of a burst access, as for the access from the second word, the memory access changes by the change in memory address 205 and memory data accessed at memory address 205 is identified. Therefore, such a period is needed and is shown as PmB. To provide such a necessary period, an output timing of the ready signal is delayed and adjusted.

In step ST2, since the CPU's of the address strobe signal has finished by this point, the flip-flop f1 118 is reset to 0 by the next leading edge of the clock, which signals the start of step ST3. The flip-flop f2 120 is set and the flip-flop f5 doesn't change. Although the processing routine advances to step ST3 in such a state change, since this step is used for adjustment of the timing as mentioned above, the signal from flip-flop f5 doesn't change. The flip-flop f2 120 is reset by the next leading edge of the clock, which signals the start of step ST4, and the flip-flop f3 121 is set. In this instance, the processing routine advances to step ST4. When the flip-flop f3 is set, the ready signal is output to the CPU through the output buffer 111. A latch enable signal is outputted to the latch 105 through the gate 117. By the enable signal, the latch allows the data from input buffer 108 to be output via output buffer 103. Further, since a count enable signal is outputted to the counter 106, the counter 106 counts up at the trailing edge of the clock in step ST4. The memory address is set to (A+1). At the same time, the flip-flop f4 122 is set by such trailing edge (in step ST4) and the gate 117 stops the generation of the latch enable signal, so that the memory data in the address A is held in the latch 105. In the case of the access of one word, the flip-flop f5 119 is reset by the leading edge of the next clock. Thus, the buffer 103 is turned off. The memory select signal which is outputted from the output buffer 123 is turned off. The cycle is finished and the processing routine is returned to the initial state.

In a case of burst access, the CPU sets the address A into the address bus in step TT1 and outputs the address strobe signal. A check is made to see if the address A is an address in which the memory has been mapped by the decoder 104. The address strobe signal is inputted to the gate 113 through the input buffer 109. When the decoder output is generated, the gate 113 is turned on and the signal is inputted to the load input LD of the counter 106. Thus, the lower two bits in the CPU address A are loaded into the counter 106 responsive to the leading edge of the clock in step TT1. The loaded address is outputted as a memory address to the memory together with the upper bits through the output buffer 107. The gate output 113 is simultaneously inputted to the D input of the flip-flop f1 118 and the J input of the flip-flop f5 119. Those flip-flops are set by the leading edge of the next clock and the processing routine advances to step TT2. In step TT2, the output buffer 103 is turned on and the data bus of the CPU is driven. The memory select signal is outputted from the output buffer 123. The reading operation of the memory is started. The flip-flop f1 118 is reset by the leading edge of the next clock and the flip-flop f2 120 is set. Step TT3 follows. Since step TT3 is a step of waiting for the data output of the memory, the signal doesn't change. The flip-flop f3 121 is set by the leading edge of the next clock and step TT4 follows. In step TT4, a latch enable signal is outputted to the latch 105 and the value of the memory data bus which is inputted through the input buffer 108 passes through the latch 105 and is outputted to the data bus of the CPU through the output buffer 103. The ready signal is transferred to the CPU from the output buffer 111, signaling the CPU that the first word can be read. At the same time, the count enable signal is outputted to the counter 106. The counter 106 counts up the address A to (A+1) by the trailing edge of the clock in step TT4 and outputs a next access address to the memory. At the same time, the latch enable signal of the latch 105 is turned off and the data at that time point is held in the latch 105. The flip-flop f4 122 is set in this instance. When the CPU executes a burst access to the memory, the addresses to be received from the CPU after the starting address A are sequential, or addresses A+1, A+2, and A+3 at the timing (position) shown by the arrow of the system clock 201 in FIG. 2 so as to read the data of one word. According to this embodiment, before the CPU updates the address, the address can be presumed and therefore can be updated by the counter, and the processing routine advances to the memory cycle of the next word without the need to wait for the address from the CPU, thereby reducing the whole access time. The latch 105 is provided to hold the data corresponding to the present address (i.e., the memory address from which data has been accessed) which is not yet read by the CPU just before the memory address is shifted to the next address until a time at which the accessed data is output to output 103 and the CPU reads such data, thereby adjusting a deviation between the CPU and the memory cycle of the memory resulting from the counter updating the address prior to the CPU providing such address. Therefore, the leading edge of the clock in the cycle TT4 is the time at which the next memory address is set before the data at the present address is read by the CPU. Since steps TT1 to TT4 relate to the first word of the burst access, the last signal (LAST) is not generated by the CPU. Therefore, the signal set in the flip-flop f4 122 passes through the gates 115 and 116 and is inputted to a D input of the flip-flop f2 120. By the leading edge of the next clock, the CPU reads the data in the address A latched in the latch 105 and outputs the next access address (A+1) to the address bus. At the same time, the flip-flop f2 120 is set, the flip-flop f3 12 is reset, the ready signal is turned off, and the CPU enters a waiting state. This state corresponds to step TT5. This step is provided to adjust the burst access time PmB of the memory. The flip-flop f4 122 is reset by the trailing edge of the clock in step TT5. By the next leading edge of the clock, the processing routine advances to step TT6, the flip-flop f2 120 is reset, and the flip-flop f3 121 is set. The latch enable signal, count enable signal, and ready signal are output. By the trailing edge in step TT7, the count-up of the counter, the latch of the memory data, and the setting of the flip-flop f4 122 are executed. In a manner similar to that mentioned above, the pre-generation of the address and the holding of the data are executed before the CPU reads the data.

As mentioned above, the processes in steps TT7 and TT8 and, further, steps TT9 and TT10 similar to steps TT5 and TT6 are repeated and the memory is sequentially burst accessed. If the last signal (LAST) indicating that the memory access relates to the last word is generated by the CPU, the CPU doesn't advance to the next cycle (as there isn't any) but turns off the memory select signal and does not need to access data bus 215. The above operation is similar to that in step ST4 when one word is accessed. The cycling of the flip-flops f2 to f4 is shut off since the last signal (LAST) turns off the gate 115. The circuit cycle is returned to the initial state.

In the embodiment described above, no consideration is made with respect to signal delay due to gates, wirings, capacitance, loads, and the like in the circuit whose timing chart is in FIG. 2. In the actual apparatus, propagation of the signal upon burst accessing is performed along the following path and delays: namely, a delay of an address output of the CPU from the clock; a wiring on an address line; a delay of the buffer gate; an access time until the output of the data from the memory; a wiring of the data line; a delay of the buffer gate; an access time until the data output from the memory; a wiring of the data line; a delay of the buffer gate; and a data set-up time of the CPU.

To perform the burst access for a word in the ordinary CPU cycle, the sum of the above processes (i.e., the processes realized in steps TT5 and TT6) has to be realized within a period Pt in FIG. 2. According to the invention, by generating the next address before the data from the current address is read by the CPU, the data propagation until the latch in the middle of the data line is executed in a period Pr and the data after it was latched is transferred to the CPU for period Pc, so that the memory access of one word can be performed substantially in a period Ps. Thus, according to this aspect of the invention, using a given memory, it is possible to access at a higher speed. Similarly, with a given clock frequency operation, the desired performance can be realized by an inexpensive memory of a lower speed.

Second Embodiment

Figure 3:
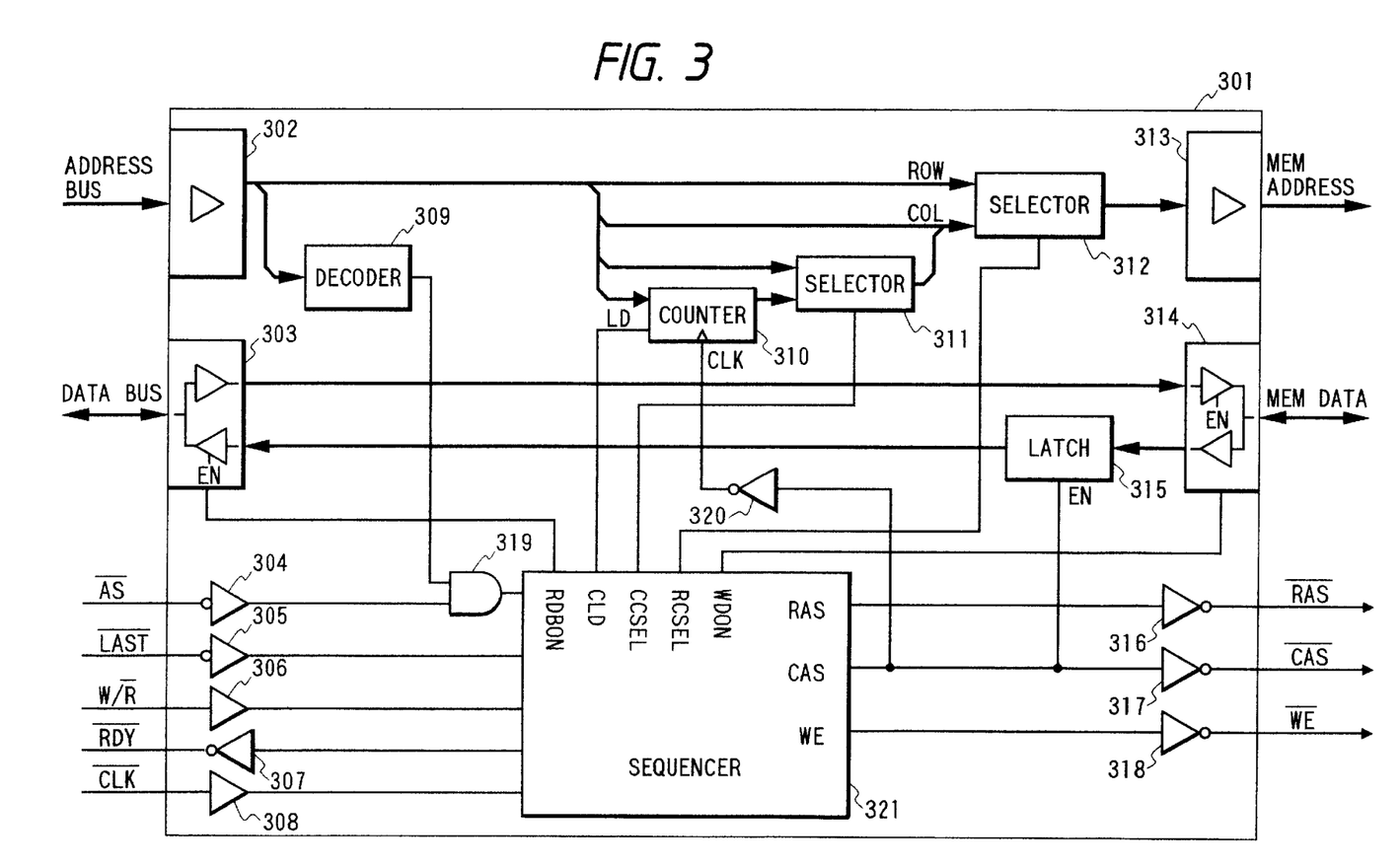
FIG. 3 is a block diagram showing the second embodiment of the invention.

FIG. 3 is a block diagram of the second embodiment of the invention and relates to an example in which the invention is applied to a dynamic RAM (DRAM) controller.

In FIG. 3, reference numeral 301 denotes a DRAM controller embodying the invention. The DRAM controller 301 is constructed by an ASIC such as a gate array of the like. A CPU (not shown) is connected to the left side in the diagram and a DRAM (not shown) is connected to the right side. Reference numeral 302 denotes an input buffer for inputting an address bus of the CPU to the DRAM controller. Reference numeral 303 indicates a bidirectional input/output buffer for inputting wire data from the data bus of the CPU or outputting read data. An output of the I/O buffer 303 is controlled by an enable signal (EN).

Reference numeral 304 denotes an input buffer for receiving an address strobe ($\overline{AS}$) indicative of the start of the access; 305 an input buffer for receiving a signal ($\overline{LAST}$) indicative of the last word of the access; 306 an input buffer for receiving a signal (W/$\overline{R}$) indicative of the reading operation or writing operation of the access; 307 an output buffer for outputting a ready signal ($\overline{RDY}$) indicating that it is ready to read or write the data upon accessing to the CPU; 308 an input buffer for inputting a clock signal (CLK); 309 a decoder for detecting that the access of the CPU lies within the mapping region of the DRAM; 310 a counter for loading the lower two bits of the access address and for counting up; 311 a selector for switching the address of the lower two bits to the address of the CPU output or the counter; 312 a selector for switching a row address of the DRAM or a column address; 313 an output buffer for outputting an address to the DRAM; and 314 an input/output buffer for receiving the read data from the data bus of the memory and for driving the write data to the data bus of the memory. An output of the I/O buffer 314 is controlled by the enable signal (EN). Reference numeral 315 denotes a latch for holding the read data outputted from the memory. When the EN input is at the H level, the latch 315 transmits the input signal and outputs as it is. When the EN input is at the L level, the latch 315 holds the present output data.

Reference numerals 316 to 318 denote memory control signals $\overline{RAS}$, $\overline{CAS}$, and $\overline{WE}$, respectively.

Reference numerals 319 and 320 denote logic gates and 321 indicates a sequencer to control the whole apparatus.

Figure 4:
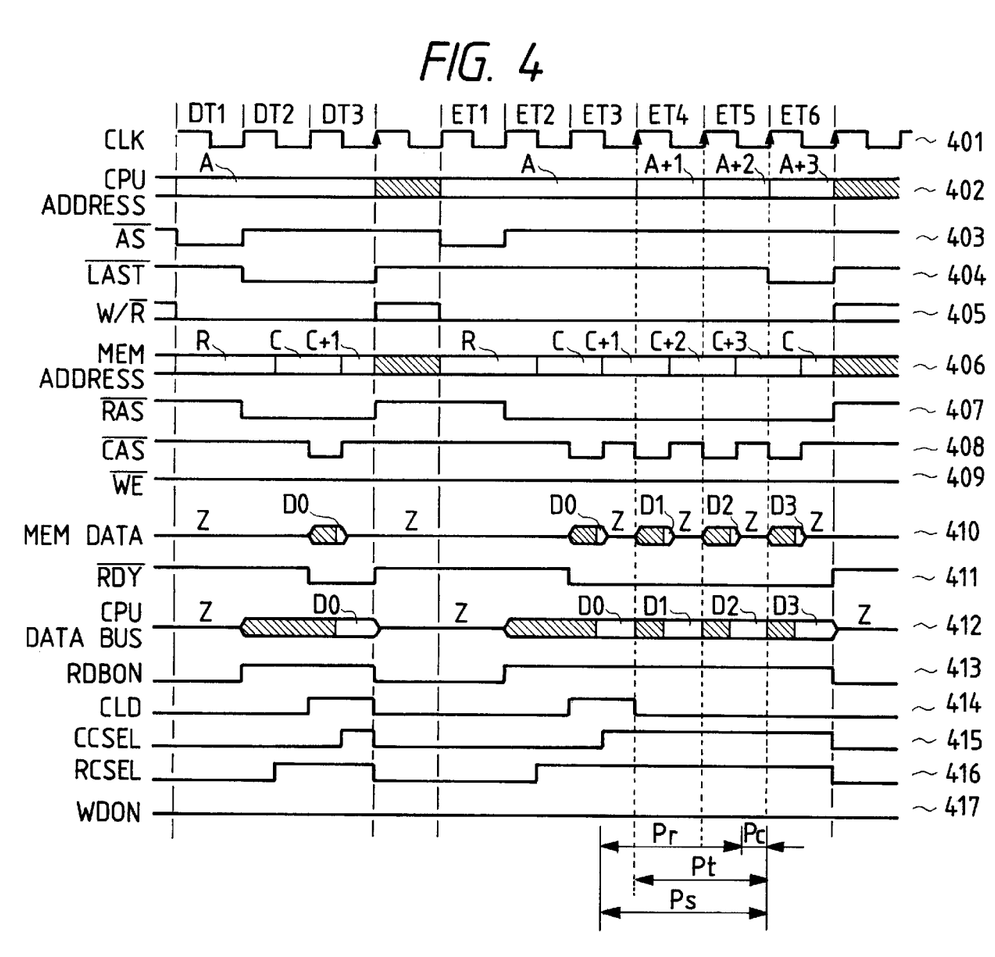
FIG. 4 is a timing chart for the second embodiment.

FIG. 4 is a diagram showing the operation and timing in the memory reading mode in this embodiment. Reference numeral 401 denotes a clock signal (CLK) and 402 indicates an address signal which is generated from the CPU.

Reference numeral 403 denotes an address strobe signal ($\overline{AS}$), 404 a last signal ($\overline{LAST}$), and 405 a signal (W/$\overline{R}$) indicative of the reading operation or writing operation.

Reference numeral 406 denotes a memory address which is outputted to the memory. R indicates a row address, C denotes a column address, R the upper bits of the access address A of the CPU, and C the lower bits.

Reference numeral 407 denotes a row address strobe signal ($\overline{RAS}$), 408 a column address strobe signal ($\overline{CAS}$), and 409 a write enable signal ($\overline{WE}$).

Reference numeral 410 denotes data which is outputted from the memory. In FIG. 4, a hatched portion shows unidentified data, z indicates a high impedance state, and D0 to D3 identified data outputted from the memory, respectively.

Reference numeral 411 denotes a ready signal ($\overline{RDY}$) to notify the CPU of a completion of the preparation of the data.

The CPU reads the data on the data bus as read data by a leading edge (shown by an arrow at the end of DT3 in the diagram) of the next clock at which the ready signal was turned on. Reference numeral 412 denotes a data bus of the CPU, and reference characters shown in the data bus 412 (i.e., D0 to D3) are the same as those in the memory data 410. Reference numerals 413 to 417 denote timing signals in the control of sequencer 321. The timing signals are generated as shown in FIG. 4.

Operating steps DT1 to DT3 denote operating steps when read accessing one word. ET1 to ET6 indicate operating steps when burst accessing four words.

The CPU sets an address onto the address bus and generates the address strobe signal indicative of the start of the access. In this instance, when the address lies within the mapping region of the DRAM, a signal is outputted from the decoder 309 and the gate 319 is turned on. Thus, a start pulse is inputted to the sequencer 321, and the sequencer 321 is activated. In FIG. 4, the sequencer 321 generates the control signals 413 to 417 and memory control signals 407 to 409 synchronously with the clock CLK, thereby executing the memory access. The memory access is stopped by the last signal 404 (LAST) from the CPU. The processing routine is returned to the initial state.

As will be understood from FIG. 4, the upper bits of the selector 312, namely, the row address is first selected and is switched to the column address by a predetermined timing RCSEL signal. In this instance, the selector 311 is selected by a CCSEL signal so as to directly couple the least significant two bits which form the burst access column address, to the output of the CPU. The counter 310 waits for the clock input in a load enable state by a CLD signal. By a rear edge of the first column address strobe signal, the counter is counted up in such a manner as to generate a value similar to the case where it is loaded from the CPU. At the same time, the sequencer 321 changes the CCSEL signal, thereby allowing the selector 311 to connect the counter 310. After that, each time one word is accessed, the clock signal is inputted to the counter 310 by the rear edge of the column address strobe signal and the address is counted up. The memory outputs the data in response to the column address strobe signal. While the column address strobe signal is outputted, the latch 315 transmits the data from the memory to the data bus of the CPU and holds the data at that time by the rear edge of the column address strobe signal. After that, by counting up the memory address, the memory accesses the next word. The CPU, however, reads the data held in the latch in response to the leading edge of the next clock signal. As a reference, the periods, Pr, Pc, Pt, and Ps are written in the diagram in a manner similar to the first embodiment. Although the operation in the writing mode is not described here, it can be similarly performed. As described above, even when the invention is applied to the DRAM controller, the invention can realize a high speed and efficient access upon burst reading mode.

Third Embodiment

Figure 5:
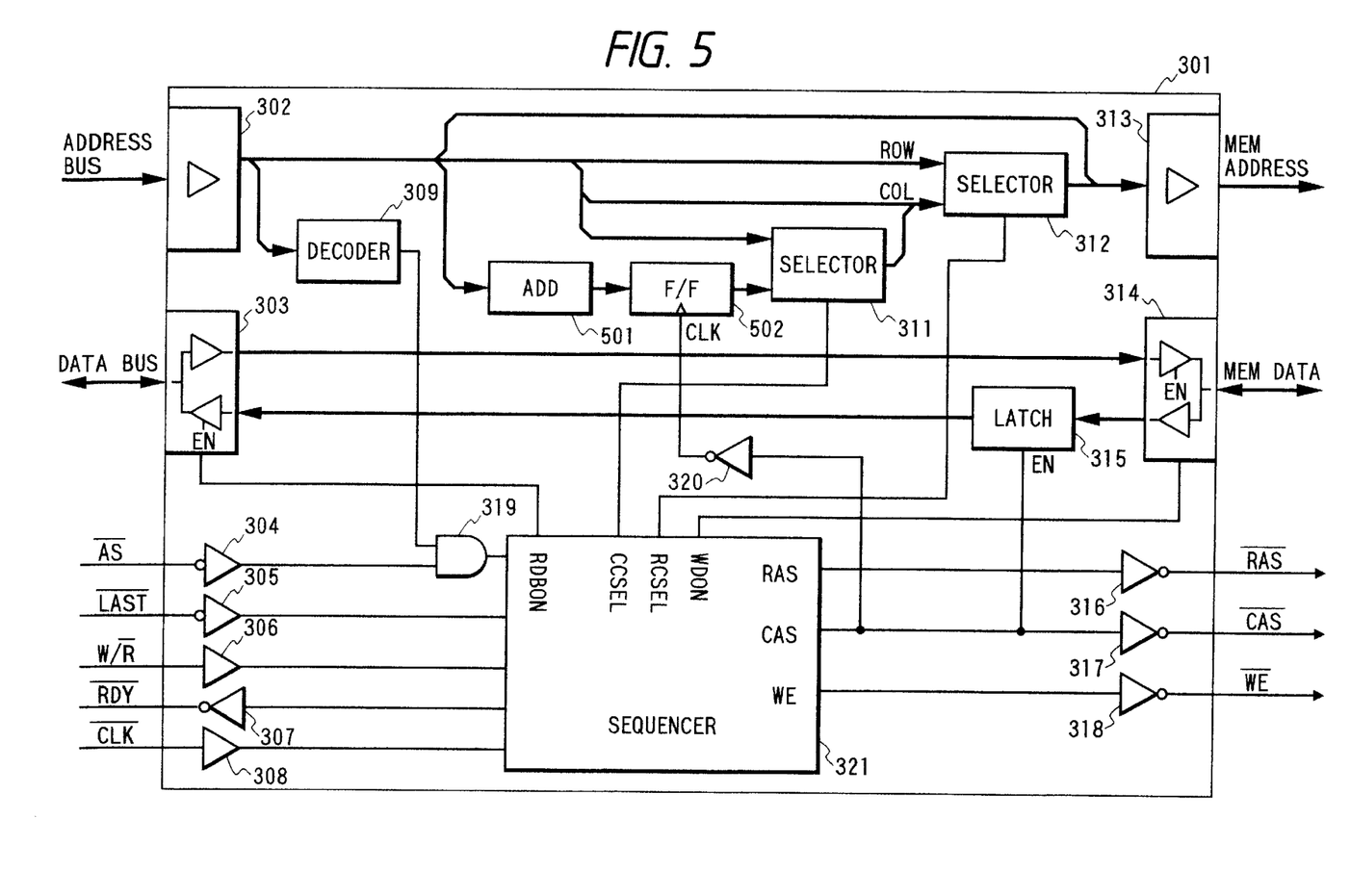
FIG. 5 is a block diagram showing the third embodiment of the invention.

FIG. 5 is a block diagram of the third embodiment of the invention. According to the embodiment of FIG. 5, the loadable counter in the second embodiment is replaced by an adder and a flip-flop (register). In FIG. 5, reference numeral 501 denotes an adder for adding 1 to the lower two bits of the memory address and generates a next address of the present access address. Reference numeral 502 denotes a flip-flop to hold the next address. As compared to the second embodiment, the next address is sequentially held and updated into the flip-flop 502 at a timing for counting up the counter and the other operations are similar to those mentioned above.

The combination of the adder and flip-flop (register) can be also applied to the first embodiment.

According to the invention described above, the data reading side such as a CPU or the like latches the data from the memory before it is read by the CPU. After the data is latched but before the data is read by the CPU, the memory address is updated and the previously read and latched data is read by the CPU. Thus, the data path is divided and the path before the latch and the path after the latch can overlappingly operate. Namely, the high speed burst reading operation of the memory can be realized by a simple circuit construction.

the same burst reading speed as that in the conventional apparatus can be obtained by an inexpensive memory of a lower speed.

What is claimed is:

1. A memory control apparatus for performing a burst access, comprising:

counter means for receiving a start address of the burst access from a processor as a current address at the start of the burst access and in each memory reading cycle of the burst access, counting up from the current address to the next address and outputting the next address to the memory;

data holding means for temporarily holding data that has been read out from the memory at the address output from said counter means until the processor is able to read in the data held in said data holding means;

instruction signal issuing means for issuing an instruction signal so as to instruct said counter means to count up from the current address to the next address and output the next address to the memory in each memory reading cycle of the burst access, after data at the current address is read out from the memory before the data at the current address is read by the processor; and ready signal issuing means for issuing a ready signal to the processor after lapse of a predetermined interval from the issue of the instruction signal.

2. An apparatus according to claim 1, wherein the burst access is finished by a burst end signal from the processor, in a case where the processor is comprised so as to generate the burst end signal.

3. An apparatus according to claim 1, wherein the memory to be burst accessed is a dynamic random access memory (DRAM).

4. An apparatus according to claim 1, wherein said counter means is a combination of an adder and a register.

* * * * *

UNITED STATES PATENT AND TRADEMARK OFFICE
CERTIFICATE OF CORRECTION

PATENT NO. : 6,751,160 B1  Page 1 of 1
DATED : June 15, 2004
INVENTOR(S) : Masahiko Murata It is certified that error appears in the above-identified patent and that said Letters Patent is hereby corrected as shown below:

Title page,
Item [57], ABSTRACT, "access" should read -- and access --.

Column 3,
Line 65, "CPU's" should read -- output --.

Column 8,
Line 34, 36 and 57, "burst" should read -- burst- --;
Lines 38, 39, and 51, "burst access" should read -- burst-access --;
Line 62, "burst accessed" should read -- burst-accessed --.

Signed and Sealed this

Twenty-eighth Day of September, 2004

JON W. DUDAS
*Director of the United States Patent and Trademark Office*